(12) United States Patent
Hirata

(10) Patent No.: US 7,972,649 B2
(45) Date of Patent: Jul. 5, 2011

(54) THIN FILM FORMING METHOD AND THIN FILM FORMING APPARATUS

(75) Inventor: Toshiharu Hirata, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 1185 days.

(21) Appl. No.: 11/573,272

(22) PCT Filed: Jul. 19, 2005

(86) PCT No.: PCT/JP2005/013258
§ 371 (c)(1),
(2), (4) Date: Feb. 6, 2007

(87) PCT Pub. No.: WO2006/013720
PCT Pub. Date: Feb. 9, 2006

(65) Prior Publication Data
US 2008/0050538 A1 Feb. 28, 2008

(30) Foreign Application Priority Data

Aug. 6, 2004 (JP) ................................. 2004-230492

(51) Int. Cl.
C23C 16/52 (2006.01)
(52) U.S. Cl. ....................................... 427/8; 427/255.28
(58) Field of Classification Search .............. 427/8, 569; 118/712, 715
See application file for complete search history.

(56) References Cited

U.S. PATENT DOCUMENTS

| | | | | |
|---|---|---|---|---|
| 6,720,260 B1 * | 4/2004 | Fair et al. | ....................... | 438/680 |
| 2004/0026037 A1 * | 2/2004 | Shinriki et al. | .......... | 156/345.33 |
| 2005/0092243 A1 * | 5/2005 | Suzuki | .......................... | 118/715 |
| 2005/0220984 A1 * | 10/2005 | Sun et al. | .......................... | 427/8 |
| 2006/0096531 A1 * | 5/2006 | Ishizaka et al. | ............... | 118/715 |

FOREIGN PATENT DOCUMENTS

| | | |
|---|---|---|
| JP | 6 89873 | 3/1994 |
| JP | 7 142392 | 6/1995 |
| JP | 2004 6733 | 1/2004 |
| JP | 2004 134 466 | 4/2004 |
| WO | WO 03/104525 | * 12/2003 |

* cited by examiner

Primary Examiner — Timothy H Meeks
Assistant Examiner — Elizabeth Burkhart
(74) Attorney, Agent, or Firm — Oblon, Spivak, McClelland, Maier & Neustadt, L.L.P.

(57) ABSTRACT

A thin film formation method is used for forming a thin film by providing a conductance valve on an exhaust path connecting a depressurizable processing chamber and a vacuum pump, arranging a processing object substrate inside the processing chamber, performing once or plural times a cycle including a first step of supplying a first reactive gas and a second step of supplying a second reactive gas into the processing chamber during a film formation processing period to cause a chemical reaction between the first reactive gas and the second reactive gas, and using the chemical reaction to form the thin film on the substrate. The thin film formation method includes a first process of supplying into the processing chamber a predetermined gas by a specified flow while exhausting the inside of the processing chamber, and determining a reference value that is equal to a valve opening level of the conductance valve causing pressure inside the processing chamber to substantially match a specified value, the first process being performed during a preparation period before the film formation processing period starts; and a second process of maintaining the valve opening level of the conductance valve at the reference value at least during the first step and the second step of the cycle performed during the film formation processing period.

20 Claims, 9 Drawing Sheets

|  | Step1 | Step2 | Step3 | Step4 | Step5 | Step6 |
|---|---|---|---|---|---|---|
| PROCESSING TIME | $T_1$ | 1 | $T_3$ | $T_4$ | $T_5$ | $T_6$ |
| ... |  |  |  |  |  |  |
| PROCESSING GAS | B | B | A, B | PURGE | B | PURGE |
| PLASMA GENERATION |  |  |  |  | * |  |
| ... |  |  |  |  |  |  |
| PRESSURE CONTROL | APC | HOLD | HOLD | HOLD | HOLD | HOLD |

PREHEAT | ALD CYCLE

THIN FILM FORMING METHOD AND THIN FILM FORMING APPARATUS

This application is a national stage Application of PCT/JP05/13258 filed Jul. 19, 2005. This application is related to and claims priority under 35 U.S.C. §119(a) to JP 2004-230492 filed Aug. 6, 2004.

TECHNICAL FIELD

The present invention relates to a film formation technology for forming a thin film on a substrate that is an object of processing (hereinafter, "processing object substrate"), and in particular, to a thin film formation method and a thin film formation apparatus employing the ALD (Atomic Layer Deposition) method.

BACKGROUND ART

It is critically important to control pressure in a processing chamber of semiconductor manufacturing equipment. Conventionally, in thin film formation apparatuses employing a chemical vapor deposition method, such as a plasma CVD apparatus or a low pressure CVD apparatus, APC (Automatic Pressure Control) is widely employed for controlling pressure in a processing chamber (see, for example, Patent Document 1).

Generally, in such an APC method, a conductance valve configured with, for example, a butterfly valve, is provided on an exhaust path connecting the processing chamber and a vacuum pump. The valve opening level of the conductance valve is variably controlled by a pressure feedback method. More specifically, the valve opening level of the conductance valve can be changed to an arbitrary value within a predetermined range of, for example, 0° (fully closed position)-90° (fully open position) with a motor controlled by a controller. A signal (instantaneous pressure level) output from a pressure detector such as a vacuum gauge attached to the processing chamber is fed back to the controller, and the controller variably controls the valve opening level of the conductance valve with the motor so that a measured pressure value matches a specified value.

In recent years, the ALD method has been attracting interest as an important film formation technology in manufacturing semiconductor apparatuses (see, for example, Patent Document 2). The ALD method is particularly advantageously applied in fields such as film formation of barrier metals used in wiring structures of semiconductor apparatuses and high dielectric films used as a gate insulating film of a MOSFET or a capacity insulating film of a capacitor. In the ALD method, a conductive film or an insulating film described above is formed by depositing a thin film by one atomic layer at a time on a processing object substrate such as a semiconductor wafer. Thus, unlike other vapor deposition methods in which a fixed amount of reactive gas is substantially continuously supplied into a processing chamber, in the ALD method, two types of reactive gas are alternately and intermittently supplied into the processing chamber at time intervals of a few seconds with purge gas supplied between the two types of reactive gas, and a layer or one atom or one molecule is formed in one cycle due to a chemical reaction of both reactive gasses. The thickness of a thin film formed on a substrate can be arbitrarily controlled by the number of times this cycle is repeated.

Patent document 1: Japanese Laid-Open Patent Application No. H7-142392

Patent document 2: Japanese Laid-Open Patent Application No. H6-080873

DISCLOSURE OF THE INVENTION

Problems to be Solved by the Invention

The ALD method has various advantages in that film formation can be performed with excellent step coverage, and film thickness and uniformity in a wafer surface can be controlled more precisely. However, the ALD method is disadvantageous in that APC cannot be used effectively for controlling pressure in the processing chamber. That is, as described above, in the ALD method, two types of reactive gas are alternately and intermittently supplied into the processing chamber at time intervals of a few seconds with purge gas supplied between the two types of reactive gas. If APC were employed in this method, a large pressure variation occurs as the supplied gas is frequently changed over, and this pressure is fed back to the APC controller, causing the valve element of the conductance valve to flutter. Accordingly, the conductance valve cannot be controlled, resulting in an adverse effect of making the processing pressure become unstable. In particular, in a PEALD (Plasma Enhanced Atomic Layer Deposition) method in which one of the two types of reactive gas is enhanced (excited) with plasma in the processing chamber to generate a reactive species, not only is reactive gas turned on/off frequently, but also the plasma is turned on/off frequently, in short cycles. Therefore, hunting is inclined to occur in the APC, such that the processing pressure becomes even more unstable and plasma ignition sometimes cannot be controlled.

Accordingly, considerations are being made to employ a method of maintaining the valve opening level of the conductance valve at a fixed value in the ALD apparatus, instead of employing APC. By employing such a method, it has been confirmed that a desired ALD film can be formed in a stable manner. However, in this valve opening level fixing method, even though an optimum valve opening level specified value (fixed value) is calculated by conducting many experiments at the stage of manufacturing the ALD apparatus, there are potential problems as described below.

The first problem is that the optimum valve opening level specified value (fixed value) changes according to installation conditions of the ALD apparatus, thus decreasing the versatility of the apparatus. For example, according to the layout of the ALD apparatus, the lengths of exhaust pipes differ and exhaust properties differ accordingly. The same problem arises when different types of vacuum pumps are employed. Therefore, in consideration of processing reproducibility, it is inappropriate to automatically apply the same valve opening level specified value (fixed value) for every apparatus. It is not impossible to calculate the optimum valve opening level specified value (fixed value) by conducting on-site trial experiments at the time of starting up each apparatus; however, this is not a realistic option to be applied to ALD apparatuses installed in a mass production line.

The second problem involves aging variations. When exhaust properties of the ALD apparatus entirely or partly change due to aging variations, the optimum valve opening level of the conductance valve changes, and the same issue as that of the first problem arises. A conceivable countermeasure is to revise or adjust the valve opening level specified value (fixed value) by periodically performing maintenance operations; however, his largely increases the down time that does not contribute to operation in a mass production line.

The present invention has been made in view of the above problems. The object of the present invention is to provide a thin film formation method and a thin film formation apparatus employing an ALD method or a method according to the ALD method capable of stably forming pressure without being affected by elements causing aging variations in the atmosphere within a processing chamber and ensuring processing reproducibility without changing the processing recipe according to installation conditions or aging variations.

Means to Solve the Problems

To achieve the above objects, the present invention provides a thin film formation method for forming a thin film by providing a conductance valve on an exhaust path connecting a depressurizable processing chamber and a vacuum pumps arranging a processing object substrate inside the processing chamber, performing once or plural times a cycle including a first step of supplying a first reactive gas and a second step of supplying a second reactive gas into the processing chamber during a film formation processing period to cause a chemical reaction between the first reactive gas and the second reactive gas, and using the chemical reaction to form the thin film on the substrate, the thin film formation method including a first process of supplying into the processing chamber a predetermined gas by a specified flow while exhausting the inside of the processing chamber, and determining a reference value that is equal to a valve opening level of the conductance valve causing pressure inside the processing chamber to substantially match a specified value, the first process being performed during a preparation period before the film formation processing period starts; and a second process of maintaining the valve opening level of the conductance valve at the reference value at least during the first step and the second step of the cycle performed during the film formation processing period.

Furthermore, the present invention provides a thin film formation apparatus for forming a thin film by providing a conductance valve or an exhaust path connecting a depressurizable processing chamber and a vacuum pump, arranging a processing object substrate inside the processing chamber, performing once or plural times a cycle including a step of supplying a first reactive gas and a step of supplying a second reactive gas into the processing chamber during a film formation processing period to cause a chemical reaction between the first reactive gas and the second reactive gas, and using the chemical reaction to form the thin film on the substrate, the thin film formation apparatus including an automatic pressure control unit configured to variably control a valve opening level of the conductance valve by a pressure feedback method such that pressure inside the processing chamber matches a specified value; a valve opening level identifying unit configured to determine a reference value that is equal to the valve opening level of the conductance valve causing the pressure inside the processing chamber to substantially match the specified value; and a valve opening level holding unit configured to maintain the valve opening level of the conductance valve at the reference value.

In the present invention, during a preparation period before a film formation processing period starts (for example, immediately before a substrate is transported inside a processing chamber during a standby time, or during a substrate heating period after the substrate has been transported inside the processing chamber), predetermined gas is supplied into the processing chamber by a specified flow while exhausting the inside of the processing chamber to make pressure inside the processing chamber substantially match a specified value, and a valve opening level of a conductance valve causing the pressure inside the processing chamber to substantially match the specified value is identified as a reference value. During a film formation processing period, the valve opening level of the conductance valve is maintained at the reference value. Therefore, even if different gases are supplied in a first step and a second step of a cycle and the atmosphere in the chamber changes, the exhaust conductance or the exhaust speed is maintained at a constant level (reference value), and therefore the process pressure is stably maintained. Even if exhaust properties change due to installation conditions or aging variations of the apparatus, an optimum exhaust conductance is specified in accordance with the process pressure at a preparation stage each time before film forming processing is performed, and therefore, processing reproducibility is ensured without changing the processing recipe.

EFFECTS OF THE INVENTION

A thin film formation method and a thin film formation apparatus according to the present invention have the above described configurations and functions, and are thus capable of stably forming pressure without being affected by elements causing aging variations in the atmosphere within a processing chamber and ensuring processing reproducibility without changing the processing recipe according to installation conditions or aging variations.

Figure 1:
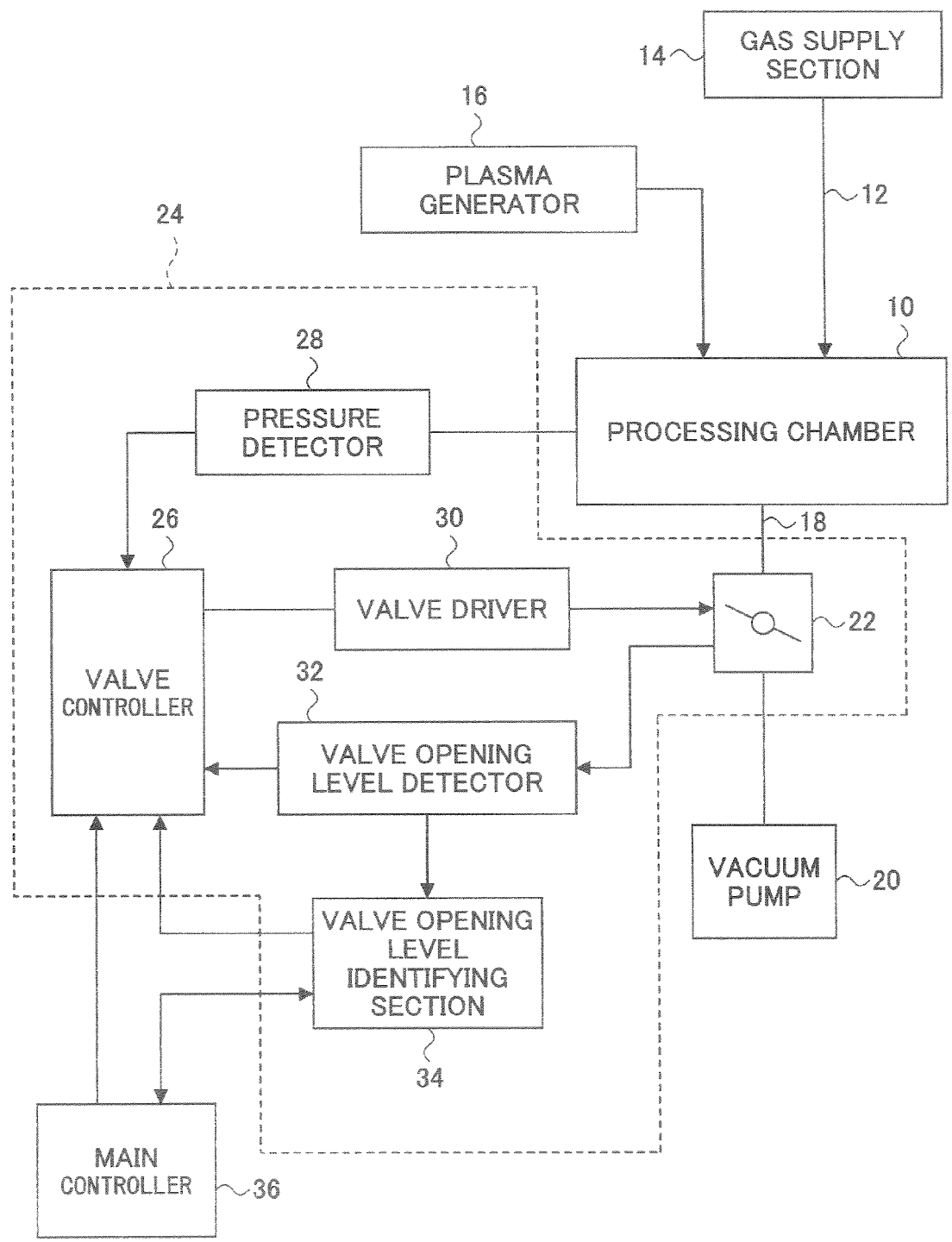
FIG. 1 is a block diagram of the basic configuration of an ALD apparatus according to an embodiment of the present invention.

DESCRIPTION OF THE REFERENCE NUMBERS 10 processing chamber
12 gas supply line
14 gas supply section
16 plasma generator
18 exhaust line (exhaust path)
20 vacuum pump
22 conductance valve
24 pressure controller
26 valve controller 28 pressure detector
30 valve driver
32 valve opening level detector
34 valve opening level identifying section
36 main controller
40 susceptor
46 shower head

BEST MODE FOR CARRYING OUT THE INVENTION

A description is given, with reference to the accompanying drawings, of an embodiment of the present invention.

FIG. 1 illustrates the basic configuration of an ALD apparatus according to the present invention. The ALD apparatus includes a processing chamber 10 that can be depressurized, a gas supply section 14 for selectively supplying processing gas such as reactive gas or purge gas required for ALD into the processing chamber 10 via a gas supply line 12, a plasma generator 16 for plasma-exciting specific reactive gas inside the processing chamber 10, a vacuum pump 20 for evacuating the processing chamber 10 via an exhaust line (exhaust path, 18 to change the pressure (degree of vacuum) to a desired level, a conductance valve 22 provided midway on the exhaust line 18, a pressure controller 24 for controlling the pressure or the exhaust conductance inside the processing chamber 10, and a main controller 36 for controlling the entire apparatus and each unit of the apparatus.

Inside the processing chamber 10, there is arranged a mounting stand or a susceptor on which a processing object substrate such as a semiconductor wafer is loaded, and there is a heater provided inside the susceptor for heating the substrate to a fixed temperature. The gas supply section 14 includes a gas supply source and a mass flow controller (MFC) for each type of processing gas. The plasma generator 16 is used in a case where PEALD is performed, which plasma generator 16 is configured with a plasma source such as parallel plate type plasma, ICP (inductively coupled plasma), or RLSA (radial line slot antenna), and is provided with a high frequency power supply for outputting high frequency at a fixed frequency level. The vacuum pump 20 is configured with, for example, a dry pump or a turbo molecular pump. The conductance valve 22 is configured with, for example, a butterfly valve, and has a valve element that is rotatable in a range of, for example, 0°-90°, such that the opening area of the exhaust path or the valve opening level can be changed to an arbitrary value in a predetermined range of 0° (fully closed position)-90° (fully open position).

The pressure controller 24 includes a valve controller 26, a pressure detector 28 attached to the processing chamber 10 or near the processing chamber 10, a valve driver 30 for driving the valve element of the conductance valve 22, a valve opening level detector 32 for detecting the valve opening level of the conductance valve 22, and a valve opening level identifying section 34 for identifying a reference value of the valve opening level of the conductance valve 22 based on a detected valve opening level obtained from the valve opening level detector 32.

The pressure detector 28 is configured with, for example, a vacuum gauge, and outputs an electric signal indicating the pressure inside the processing chamber 10. The valve driver 30 is configured with, for example, a servo motor, and changes the position of the valve element or the valve opening level of the conductance valve 22 under the control of the valve controller 26. The valve opening level detector 32 is connected to, for example, the valve element of the conductance valve 22, and includes a potentiometer for outputting analog voltage signals indicating the valve opening level of the conductance valve 22, and an A/D converter for converting the signals output from the potentiometer to digital signals at a predetermined sampling frequency (for example, 10 kHz). The configuration and functions of the valve opening level identifying section 34 are described below.

The valve controller 26 can operate in cooperation with the pressure detector 28 and the valve driver 30 to configure a pressure feedback loop for variably controlling the valve opening level of the conductance valve 22 such that the pressure inside the processing chamber 10 matches a specified value. The valve controller 26 can also operate in cooperation with the valve opening level detector 32 and the valve driver 30 to configure a feedback loop for causing the valve opening level of the conductance valve 22 to match a reference value, that is, to maintain the conductance or the practical exhaust speed of the exhaust line 18 at a fixed value. The valve controller 26 can change over from performing one of the above two types of feedback control functions to another, according to a control signal received from the main controller 36.

Next, operations of the ALD apparatus are described with reference to a flowchart shown in FIG. 2. The operations performed by this apparatus are executed under the control of the main controller 36 according to predetermined software.

First, the semiconductor wafer serving as the processing object substrate is transported into the processing chamber 10 and loaded on the susceptor (step S1).

Next, before the ALD film formation processing, a certain amount of time is spent to heat the semiconductor wafer on the susceptor to a specific temperature appropriate for film formation. During this wafer heating period (preheating period), the gas supply section 14 supplies predetermined pressure control gas by a predetermined flow into the processing chamber 10, the valve controller 26 in the pressure controller 24 performs pressure feedback control by an APC method, and the valve opening level identifying section 34 identifies the reference value of the valve opening level (step S2).

Specifically, the valve controller 26 receives an output signal (detected pressure) from the pressure detector 28, compares the detected pressure with a specified pressure that is received beforehand from the main controller 36 to generate a comparative error, and supplies a control signal to the valve driver 30 according to the comparative error in order to make the comparative error approach near zero, thus variably controlling the valve opening level of the conductance valve 22. According to this APC operation, pressure inside the processing chamber 10 is maintained near the specified pressure. The pressure control gas supplied from the gas supply section 14 is preferably the same type and has the same flow as those of a reactive gas that can affect the pressure in the processing chamber 10, so that a gas load equivalent to that of the ALD cycle is provided inside the processing chamber 10.

While the above described APC operation is being performed, the valve opening level (instantaneous value) of the conductance valve 22 is detected by the valve opening level detector 32, and the detected valve opening level or a sample value is provided from the valve opening level detector 32 to the valve opening level identifying section 34 at fixed time intervals (for example, 100 ms).

Figure 3:
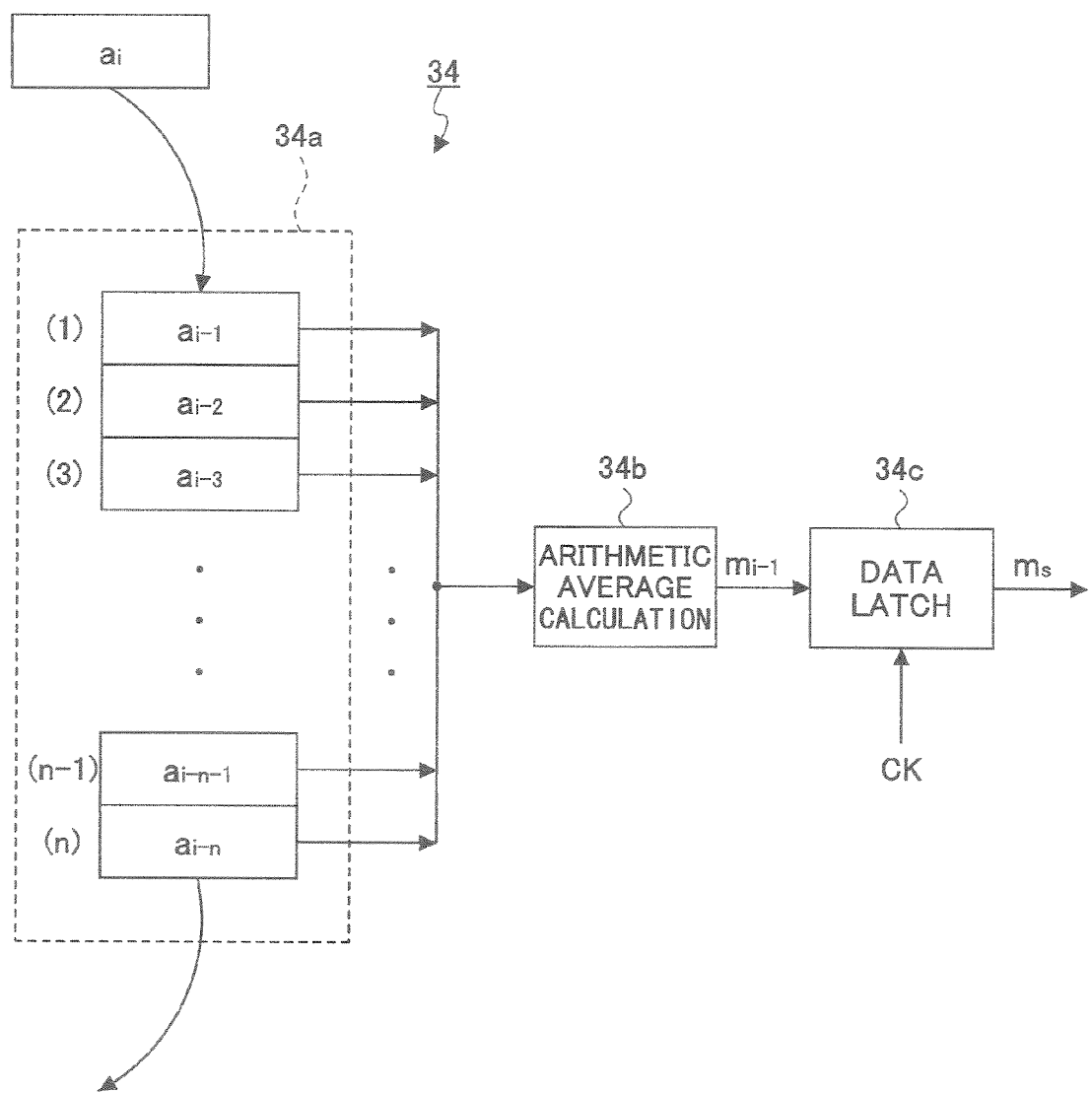
FIG. 3 is a block diagram of an example of a configuration of a valve opening level identifying section according to the embodiment.

As shown in FIG. 3, one example of a configuration of the valve opening level identifying section 34 includes a FIFO buffer memory 34a, an arithmetic average calculation section 34b, and a data latch circuit 34c. The FIFO buffer memory 34a can hold n (n being a whole number, for example, n=30) sample values at a time by a first in, first out method, which sample values are provided from the valve opening level detector 32 in time series at the abovementioned time intervals (100 ms). Therefore, every time a new sample value $a_i$ from the valve opening level detector 32 is written in the FIFO buffer memory 34a, among the 30 sample values that are held up to this point, the oldest sample value $a_{i-n}$ (n values before $a_i$) is pushed out and discarded outside the FIFO buffer memory 34a.

The arithmetic average calculation section 34b calculates the arithmetic average of the n sample values presently loaded in the FIFO buffer memory 34a at the abovementioned time intervals (100 ms), and outputs or renews the arithmetic average m. In the example shown in FIG. 3, immediately before the sample value $a_i$ is written into the FIFO buffer memory 34a, the arithmetic average calculation section 34b outputs an arithmetic average $m_{i-1}$ obtained by $(a_{i-1}+a_{i-2}+a_{i-3}+ \ldots + a_{i-n-1}+a_{i-1})/n$. When the new sample value $a_i$ is written in the FIFO buffer memory 34a, the sample value $a_{i-n}$ is discarded, and the arithmetic average calculation section 34b outputs an arithmetic average $m_i$ obtained by $(a_i+a_{i-1}+a_{i-2}+ \ldots + a_{i-n-2}+a_{i-n-1})/n$.

The data latch circuit 34c latches the arithmetic average m output from the arithmetic average calculation section 34b in response to a timing signal CK received from the main controller 36. An arithmetic average $m_s$ latched by the data latch circuit 34c is identified as a representative value or a reference value of the valve opening level of the conductance valve 22 in the above described APC operation and the arithmetic average $m_s$ is supplied to the main controller 35 and the valve controller 26.

This reference value $m_s$ of the valve opening level is used in the ALD film formation processing that starts as soon as the preheating is finished. Therefore, the valve opening level identifying processing performed by the valve opening level identifying section 34 is preferably performed immediately before the preheating period ends.

When the valve opening level reference value $m_s$ is received from the valve opening level identifying section 34, the valve controller 26 stops the pressure feedback control operation employing the APC method, which had been performed through the pressure detector 28 and the valve driver 30, and changes over to performing, through the valve opening level detector 32 and the valve driver 30, a feedback control operation for maintaining the valve opening level of the conductance valve 22 at the valve opening level reference value $m_s$ (step S3). In this feedback control operation for maintaining the valve opening level (HOLD valve opening level), the valve controller 26 compares a detected valve opening level or a sample value a supplied from the valve opening level detector 32 with the reference value $m_s$ at fixed time intervals (100 ms), generates a comparative error, and supplies a control signal to the valve driver 30 according to the comparative error in order to make the comparative error approaches near zero, thus maintaining the valve opening level of the conductance valve 22 near the reference value $m_s$. By this HOLD valve opening level operation, the exhaust conductance or the exhaust speed in the exhaust system of the processing chamber 10 is maintained at a fixed level during the ALD processing operation. The detected valve opening level can be supplied from the valve opening level detector 32 to the valve controller 26 at time intervals (sampling cycle) different to the time intervals at which signals are provided to the valve opening level identifying section 34; the detected valve opening level can also be analog signals.

During the ALD processing, the same ALD cycle (steps S4 to S7) is repeated a plural number of times (step S8, S9). One ALD cycle basically includes four phases, i.e., the first, second, third, and fourth steps (steps S4, S5, S6, and S7). In the first step in step S4, processing gas A (first reactive gas) is supplied from the gas supply section 14 into the processing chamber 10, and molecules of the processing gas A sent into the processing chamber 10 corresponding to one molecule layer adhere onto the semiconductor wafer as a precursor. In the second step in step S5, purge gas, which comprises, for example, inert gas, is supplied from the gas supply section 14 into the processing chamber 10. Excessive processing gas A remaining inside the processing chamber 10 that did not adhere onto the semiconductor wafer is discharged outside the processing chamber 10. In the third step in step S6, a processing gas B (second reactive gas) is first supplied from the gas supply section 14 into the processing chamber 10 (step S6A). At this point, in a case where the PEALD method is employed, the plasma generator 16 is turned on to turn the processing gas B into plasma in the processing chamber 10 (step S6B), and a chemical reaction is caused between reactive species (radical or ion) of the processing gas B and the processing gas A adhering on the semiconductor wafer. Due to this chemical reaction, the thin film is deposited on the semiconductor wafer by a layer of one atom or one molecule. After a certain amount of time passes, plasma-excitation is stopped (step S6C), and the third step (step S6) ends. In the fourth step in step S7, a purge gas, which comprises, for example, inert gas, is supplied from the gas supply section 14 into the processing chamber 10. Excessive processing gas B remaining inside the processing chamber 10 that did not adhere onto the semiconductor wafer is discharged outside the processing chamber 10.

In a case where the PEALD method is employed, the processing gas B effectively reacts with the processing gas A only while it is being plasma-excited. Accordingly, the processing gas B can be supplied into the processing chamber 10 not only at the third step in step S6 but also, for example, during the first and second steps in steps S4 and S5.

When the above described ALD cycle (steps S4-S7) is repeated for a predetermined number of times, it is determined that the thickness of the thin film on the semiconductor wafer has reached a desired level (step S8), and the ALD film formation processing ends. Next, the semiconductor wafer that has undergone the processing is unloaded from the susceptor and transported outside the processing chamber 10 (step S10).

As described above, in the ALD apparatus according to the present embodiment, during the wafer heating period (preheating period) before the ALD film formation processing, a gas load simulating ALD film formation processing is supplied into the processing chamber 10 to perform feedback control with the APC method, and the valve opening level of the conductance valve 22 causing the gas pressure inside the processing chamber 10 to substantially match a specified value is identified (determined) as a reference value. During the ALD processing, a feedback control operation is performed to make the valve opening level of the conductance valve 22 match the reference value, so that even if the gas type supplied in the processing chamber 10 in the ALD cycle is changed over at time intervals of a few seconds, the exhaust conductance can be maintained at a fixed level, and the processing pressure can be stably maintained.

Furthermore, in the present embodiment, all operating ALD apparatuses can constantly operate (in units of sheet processing) with an optimum exhaust conductance according to a specified pressure value, without being affected by installation conditions or aging variations. Therefore, processing reproducibility can be ensured without changing the processing recipe. Accordingly, versatility of the ALD apparatus is enhanced and maintenance of the ALD apparatus is facilitated. Moreover, it is possible to provide an ALD apparatus serving as a thin film formation apparatus that is practical enough to be applied in a mass production line.

It is also possible to identify the valve opening level of the conductance valve 22 by performing feedback control with the APC method when a semiconductor wafer is not loaded in the processing chamber 10, for example, immediately before transporting the semiconductor wafer into the processing chamber 10, or in a standby status.

Figure 4:
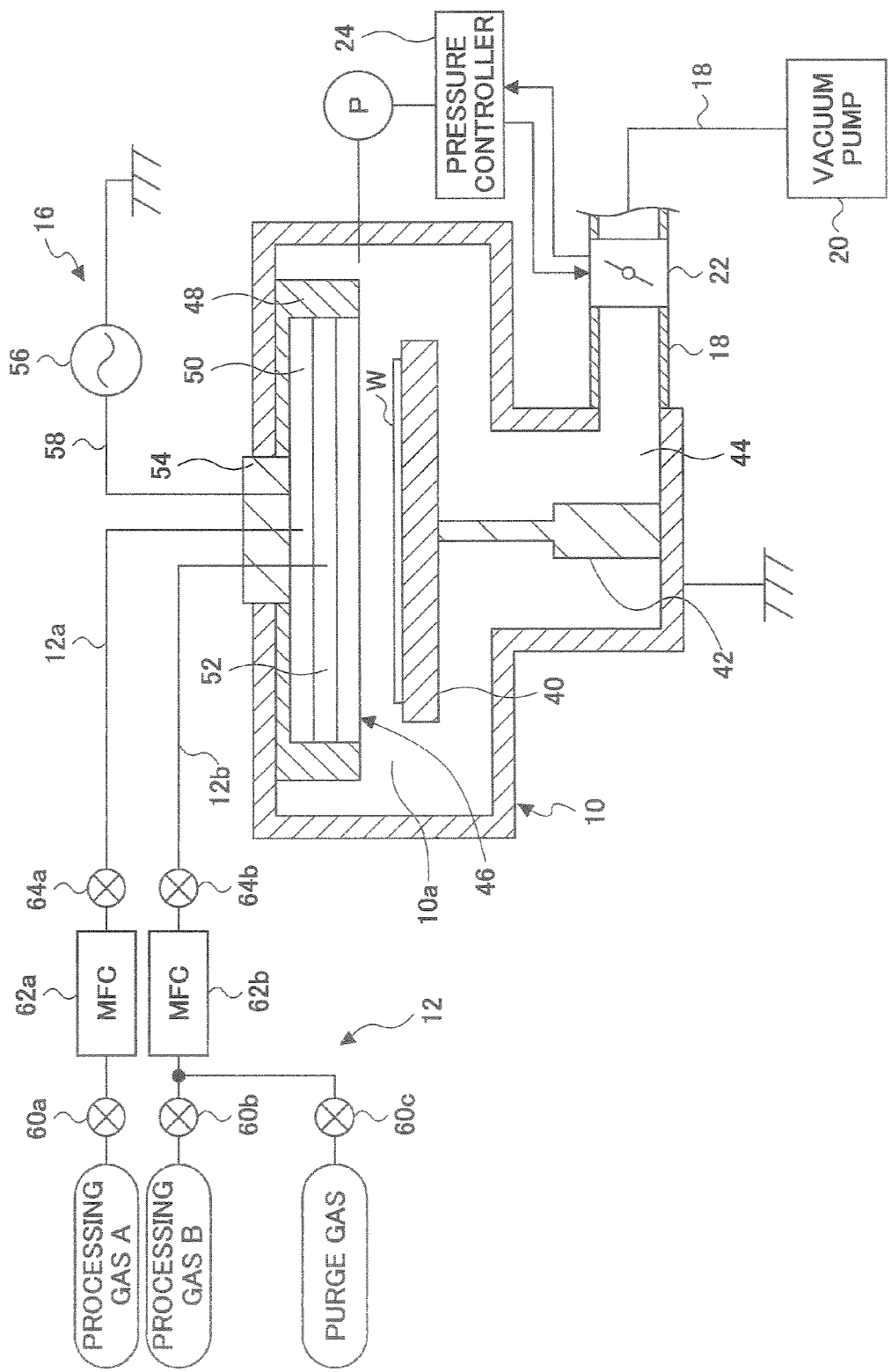
FIG. 4 is a schematic cross section side view of relevant parts of an ALD apparatus used for forming a conductive film according to the embodiment.
Figure 5:
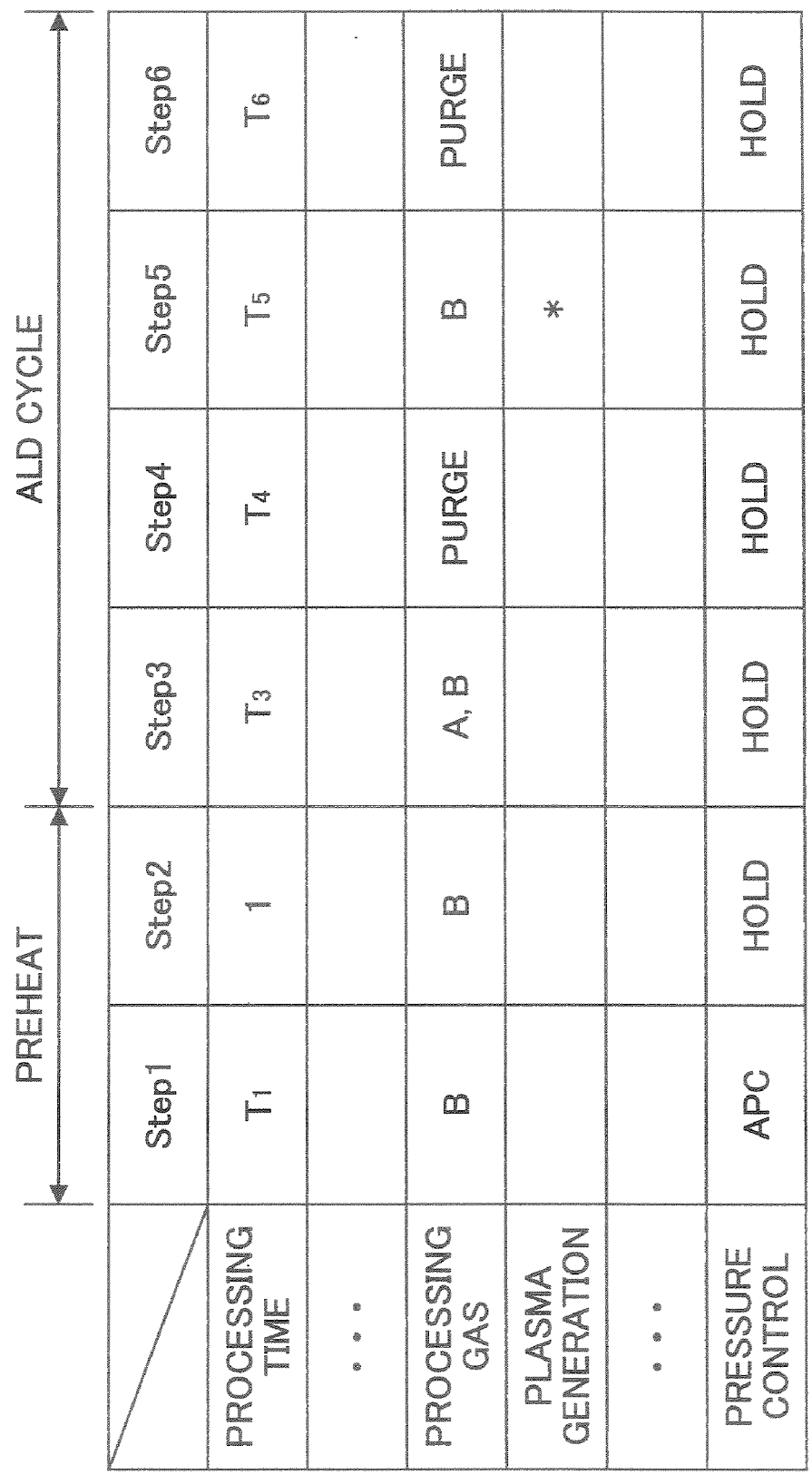
FIG. 5 is a recipe table indicating an example of a recipe according to the embodiment.
Figure 6:
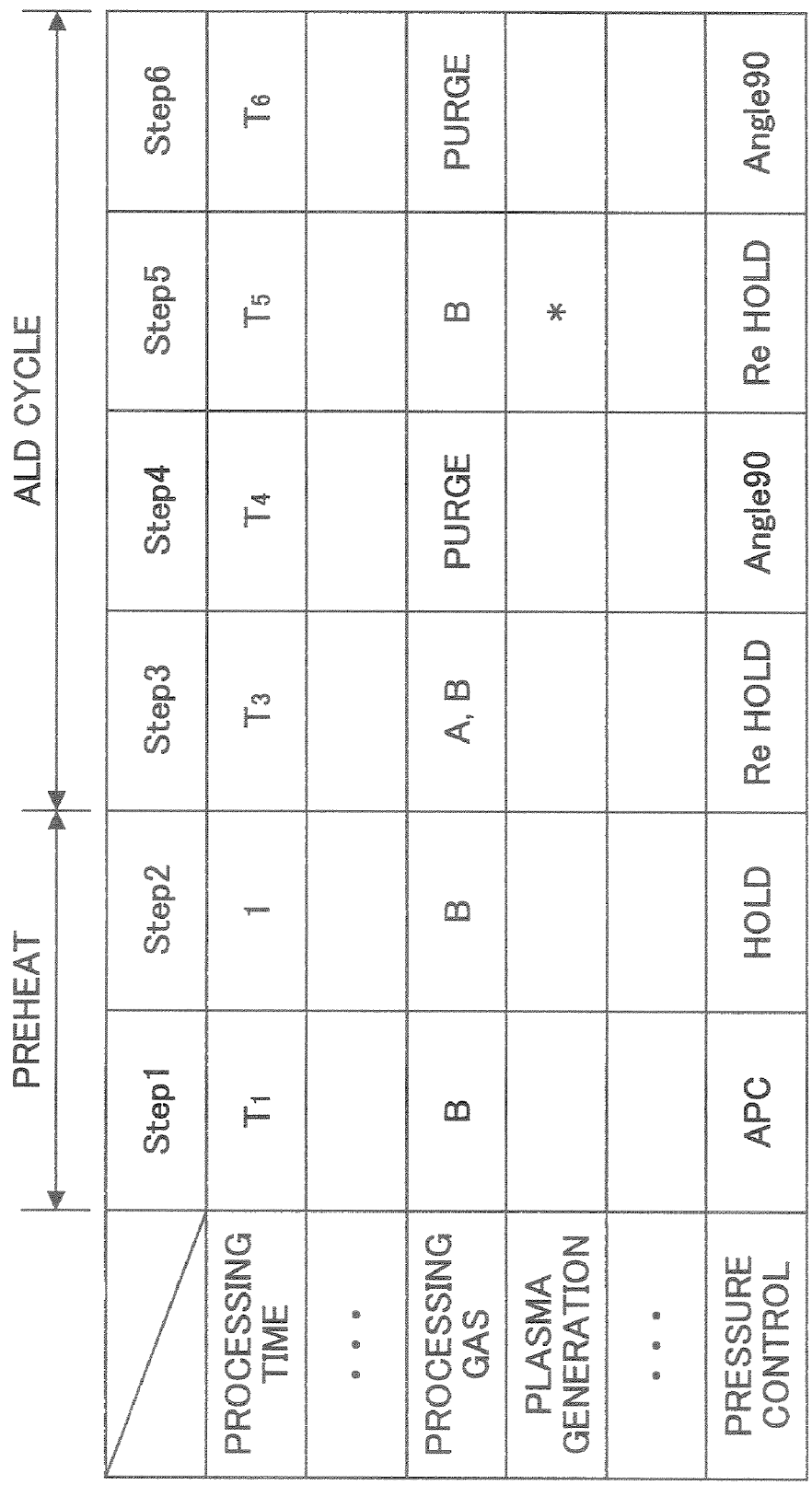
FIG. 6 is a recipe table indicating an example of a recipe according to a modification of the embodiment.

Next, with reference to FIGS. 4-6 an ALD apparatus for forming a conductive film is described as a specific example of the above described embodiment. FIG. 4 is a schematic cross section view of relevant parts of the ALD apparatus, FIG. 5 is a recipe table indicating main processing conditions (portion) used in the ALD apparatus, and FIG. 6 is a timing chart indicating a sequence of operations performed by the ALD apparatus. In FIG. 4, elements having the same configuration or function as those in FIG. 1 are denoted by the same reference numbers.

In FIG. 4, the processing chamber 10 of this ALD apparatus is made of, for example aluminum with an anodized surface or SUS (stainless steel), and is protectively grounded. In the center of the processing chamber 10 is provided a susceptor 40 for loading a semiconductor wafer W serving as the processing object substrate. This susceptor 40 is made of a material with excellent corrosion resistance and heat resistance such as Hastelloy, and is horizontally supported by a supporting section 42 that extends perpendicularly upward from the bottom of the processing chamber 10. The susceptor 40 has a built in heater (not shown), so that the semiconductor wafer W can be heated to a desired temperature.

On a side wall of the processing chamber 10, a substrate transportation opening (not shown) is provided, which can be opened/closed by a gate valve (not shown). At the bottom of the processing chamber 10, an exhaust port 44 is provided. The exhaust line (exhaust path) 18 that communicates to the vacuum pump 20 is connected to the exhaust port 44, and the conductance valve 22 is provided midway on the exhaust line 18. The valve opening level of the conductance valve 22 is controlled by the pressure controller 24, similarly to the basic embodiment described above (FIG. 1).

In the processing chamber 10, a cylindrical shower head 46 also serving as an upper electrode is provided above the susceptor 40 with a certain space therebetween. An insulating shield member 48 made of quartz or ceramics such as $Al_2O_3$ is provided on surfaces (side surfaces and top surface) of the shower head 46 other than the gas ejecting surface (bottom surface). The shower head 46 includes a first gas induction room 50 and a second gas induction room 52 divided into separate stages, so that two different types of reactive gas can separately pass through the gas induction rooms to be introduced into a processing space 10a inside the processing chamber 10.

The top surface of the processing chamber 10 has an opening, and an insulating member 54 is inserted into the opening. A conductor 58 connected to a high frequency power supply 56 of the plasma generator 16 is inserted through the insulating member 54 and is connected to the top of the shower head 46. A high frequency output from the high frequency power supply 56 by a predetermined level of power is applied to the shower head 46 via the conductor 58, so that a high frequency electric field is formed between the shower head 46 and the susceptor 10 for generating plasma by a parallel plate method.

The gas supply section 14 of the ALD apparatus includes gas supply sources provided individually for each of the processing gas A, the processing gas B, and the purge gas. The processing gas A comprises source gas including, as a chemical compound, crude material of the conductive film, the processing gas B comprises reducing gas for reducing a metallic compound of the processing gas A, and the purge gas comprises rare gas or inert gas. For example, when forming a Ta film to be used for a Cu diffusion prevention film, a mixture of gas obtained by mixing vaporized $TaCl_5$ and carrier gas such as Ar gas is used as the processing gas A, $H_2$ gas is used as reducing gas, and Ar gas is used as the purge gas.

A gas supply source of the processing gas A is connected to the first gas induction room 50 of the shower head 46 via a first gas supplying line 12a. An opening/closing valve 60a, a first mass flow controller (MFC) 62a, and an opening/closing valve 64a are provided midway on the first gas supplying line 12a. Meanwhile, gas supply sources of the processing gas B and the purge gas are connected to the second gas induction room 52 of the shower head 46 via a second gas supplying line 12b.

Opening/closing valves 60b, 60c a second mass flow controller (MFC) 62b, and an opening/closing valve 64b are provided midway on the second gas supplying line 12b.

Similar to the basic apparatus (see FIG. 1), in this ALD apparatus, the main controller 36 controls the entire apparatus and each unit of the apparatus. The main controller 36 operates by incorporating into software processing conditions that are specified and input via a recipe table (see FIG. 5). Among the processing conditions, the recipe table shown in FIG. 5 indicates specified values of items particularly relevant to the present invention.

In this ALD apparatus, the same steps or processing sequence as those of the basic steps (see FIG. 2) can be performed to form a desired conductive film (for example, a Ta film). The recipe table shown in FIG. 5 for this example corresponds to the steps shown in FIG. 2 as described below. That is, during the preheating period, Step1 corresponds to step S2 and Step2 corresponds to step S3. In the ALD cycle, Step3 corresponds to step S4, Step4 corresponds to step S5, Step5 corresponds to step S6 (S6A, S6B, S6C), and Step6 corresponds to step S7. Functions and operations of this ALD apparatus are described below by following the contents of the recipe table shown in FIG. 5.

The required time and the type and flow of gas supplied into the processing chamber 10 are specified and input for each of Step1-Step6 in the recipe table shown in FIG. 5. In the example shown in FIG. 5, Step1 indicates instructions to supply the processing gas B within an arbitrarily specified time T1 (for example, 60 seconds) in an APC mode. As described above, during the APC operation, the valve opening level detector 32 and the valve opening level identifying section 34 in the pressure controller 24 operate automatically, and the valve opening level of the conductance valve 22 is monitored.

Step2 is incorporated at a predetermined timing immediately before the preheating period ends, such as one second before the preheating period ends, and "HOLD" is instructed as the pressure control mode. At the timing when Step2 starts, a control signal CK is supplied from the main controller 36 to the valve opening level identifying section 34 to determine or identify a reference value $m_s$ of the valve opening level, and the pressure control mode is changed over from APC to HOLD valve opening level.

In the ALD cycle, as shown in the recipe table (FIG. 5), the pressure control mode is instructed as "HOLD" throughout Step3-Step6. In accordance with this recipe, the apparatus fixes the pressure control mode to HOLD valve opening level throughout the duration of ALD film formation processing. In Step3, in addition to the prerequisite processing gas A, the processing gas B is also specified as gas to be supplied to the processing chamber 10. In PEALD, unless the plasma is turned on, the processing gas B (reducing gas) does not perform its (reducing) functions and therefore, the processing gas A is not obstructed from adhering to the semiconductor wafer.

Accordingly, no adverse effects are caused by mixing the processing gas B with the processing gas A. It is in fact more advantageous to supply the processing gas B inside the processing chamber 10 before Step5 starts in that the plasma can be ignited safely and surely. Considering this advantage, also in the purging operation of Step4, the processing gas B (reducing gas) is preferably supplied into the processing chamber 10 together with the purge gas (Ar gas).

In the PEALD method for forming a conductive film, the flow of the processing gas A (source gas) is considerably smaller than the flow of the processing gas B (reducing gas), and therefore, the flow of the processing gas B (reducing gas) can be used as a reference. Accordingly, when identifying the valve opening level of the conductance valve 22 in the APC mode during the preheating period as described above, the processing gas B (reducing gas) can be supplied into the processing chamber 10 by a gas load equivalent to that of the ALD cycle. It is also possible to use an appropriate amount of inert gas or mix the inert gas together with the processing gas B.

In Step5, plasma-excitation is performed on the processing gas B ($H_2$ gas). By performing plasma-excitation, H+/H* (hydrogen ion and hydrogen radical) is generated from $H_2$ gas. These reactive species (H+/H*) form a film corresponding to one atomic layer by reducing the conductive chemical compound adhering to the surface of the semiconductor wafer W at an atomic layer level. By the HOLD valve opening level function according to the present invention, the exhaust conductance is fixed at a fixed level, so that pressure inside the processing chamber 10 is stably maintained. Accordingly, the plasma of the processing gas B ($H_2$ gas) can be ignited safely and surely. In the purging operation of Step6, the remaining processing gas B (reducing gas) is discharged, and therefore, it is only necessary to supply the purge gas (Ar gas) into the processing chamber 10. Each of the processing times $T_1$-$T_6$ of Step3-Step6 are usually specified to be 3-5 seconds.

In the embodiment described above, the pressure controller 24 continues the pressure control operation of HOLD valve opening level throughout the duration of the ALD film formation processing. However, when purging is performed, the valve opening level of the conductance valve 22 does not need to be in conformance with pressure levels of the processing gas A and the processing gas B. In fact, for the purpose of purging, the valve opening level is preferably as high as possible (ideally fully open) in order to use the purge gas efficiently and to reduce time. According to the present invention, such a requirement can be satisfied by partially modifying the above described embodiment. This modification is described with reference to a recipe table shown in FIG. 6 and a flowchart shown in FIG. 7.

In the recipe table (FIG. 6) for this example, "ReHOLD" is instructed in Step3 and Step5 of the ALD cycle, at which the processing gas A and the processing gas B are supplied, respectively. "ReHOLD" means to change over to the HOLD valve opening level mode once again, i.e., to retain the valve opening level of the conductance valve 22 at the reference value $m_s$ once again. At Step3 and Step5 where purging is performed, "Angle90" is instructed. "Angle90" means to retain the valve opening level of the conductance valve 22 at 90° (fully open).

Figure 2:
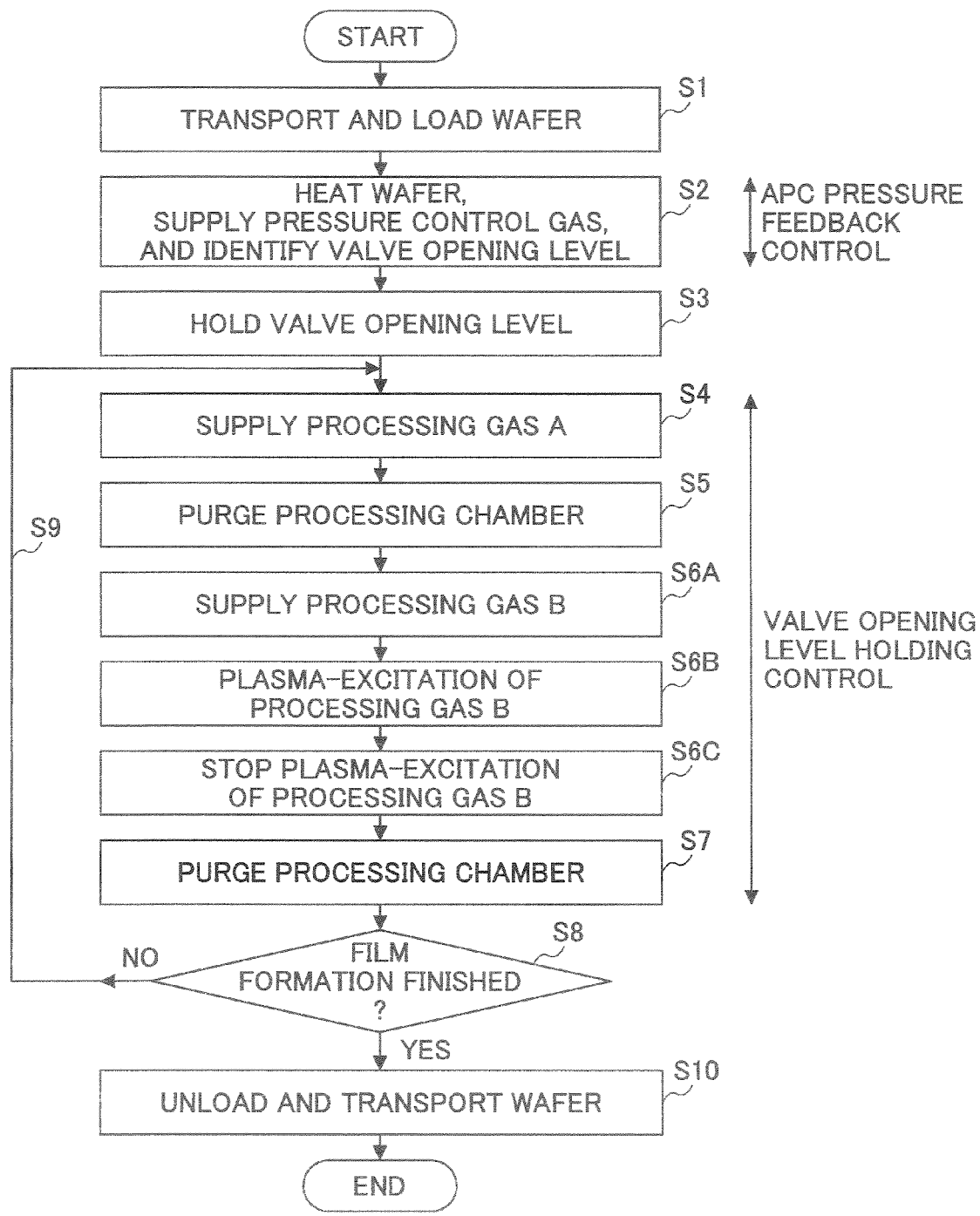
FIG. 2 is a flowchart indicating the basic procedures of operations performed by the ALD apparatus according to the embodiment.
Figure 7:
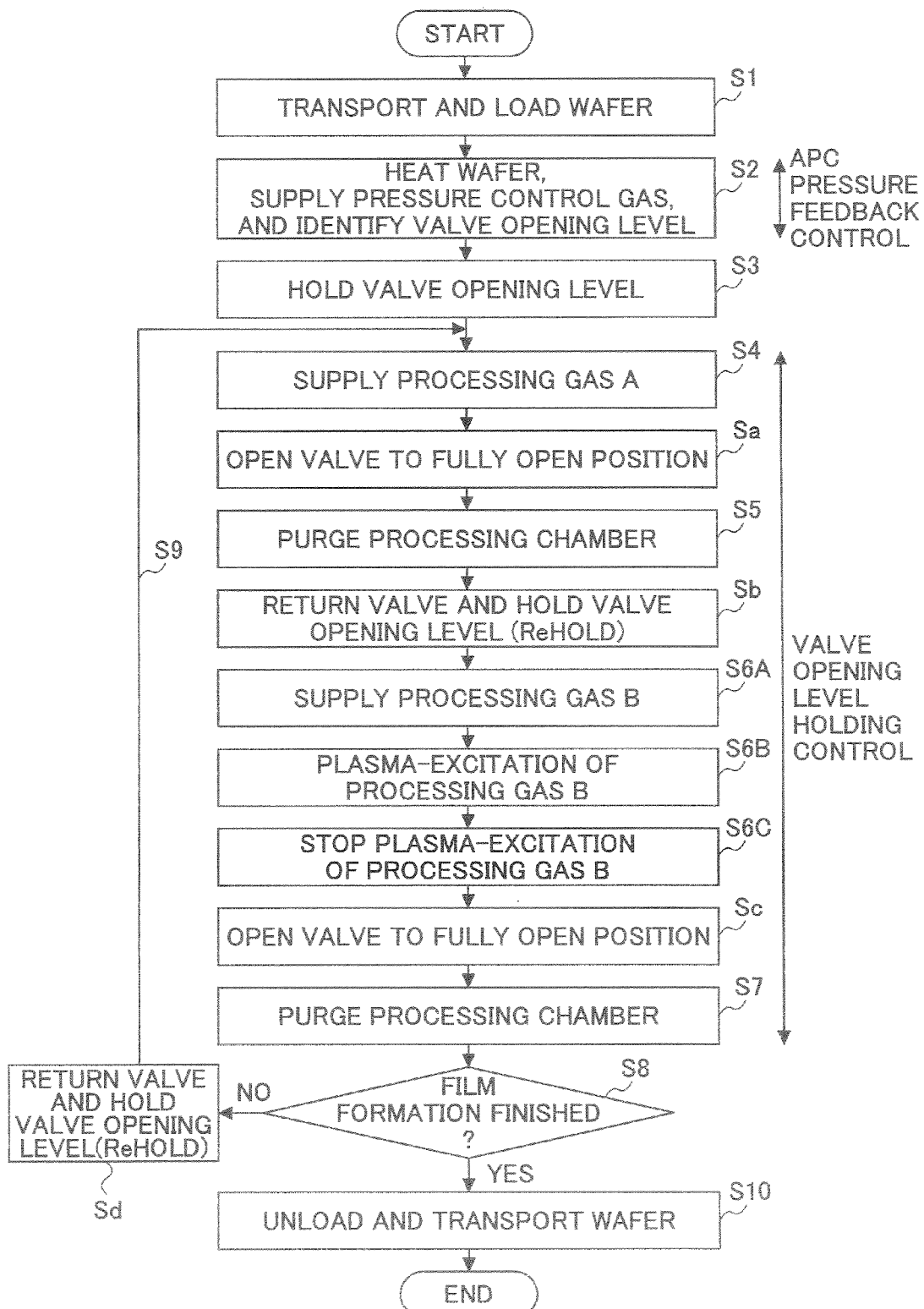
FIG. 7 is a flowchart indicating procedures of operations performed by an apparatus according to the modification of the embodiment.

In FIG. 7 steps Sa and Sc of "fully opening valve" and steps Sb and Sd of "ReHOLD valve opening level" are added to the basic procedures shown in FIG. 2. Accordingly, immediately after step S4 (Step3) of supplying the processing gas A, the valve opening level of the conductance valve 22 is changed from the reference value $m_s$ to the maximum value (90°) in step Sa. In step S5 (Step4), purging is performed at a maximum exhaust velocity. Immediately before step S6 (Step5) of supplying the processing gas B, the valve opening level of the conductance valve 22 is changed from the maximum value (90°) to the reference value $m_s$ in step Sb. Similarly, after the processing gas B is supplied, immediately before purging is performed in step S7 (Step6), the valve opening level of the conductance valve 22 is changed to the maximum value (90°) in step Sc. Immediately after purging is performed in step S7 (Step6), the valve opening level is returned to the reference value $m_s$ in step Sd. It is also possible to fix the valve opening level of the conductance valve 22 at 80° while purging is performed by specifying "Angle80" in the recipe table (FIG. 6).

The above embodiment employs PEALD; however, the present invention is also applicable to an ALD method without using plasma. In such a case, in the steps of the ALD cycle, the processing gas A and the processing gas B should not be supplied at the same time so that the processing gas A and the processing gas B do not react with each other in the vapor phase. Furthermore, the exhaust conductance is preferably controlled independently when supplying the processing gas A and the processing gas B.

Figure 8:
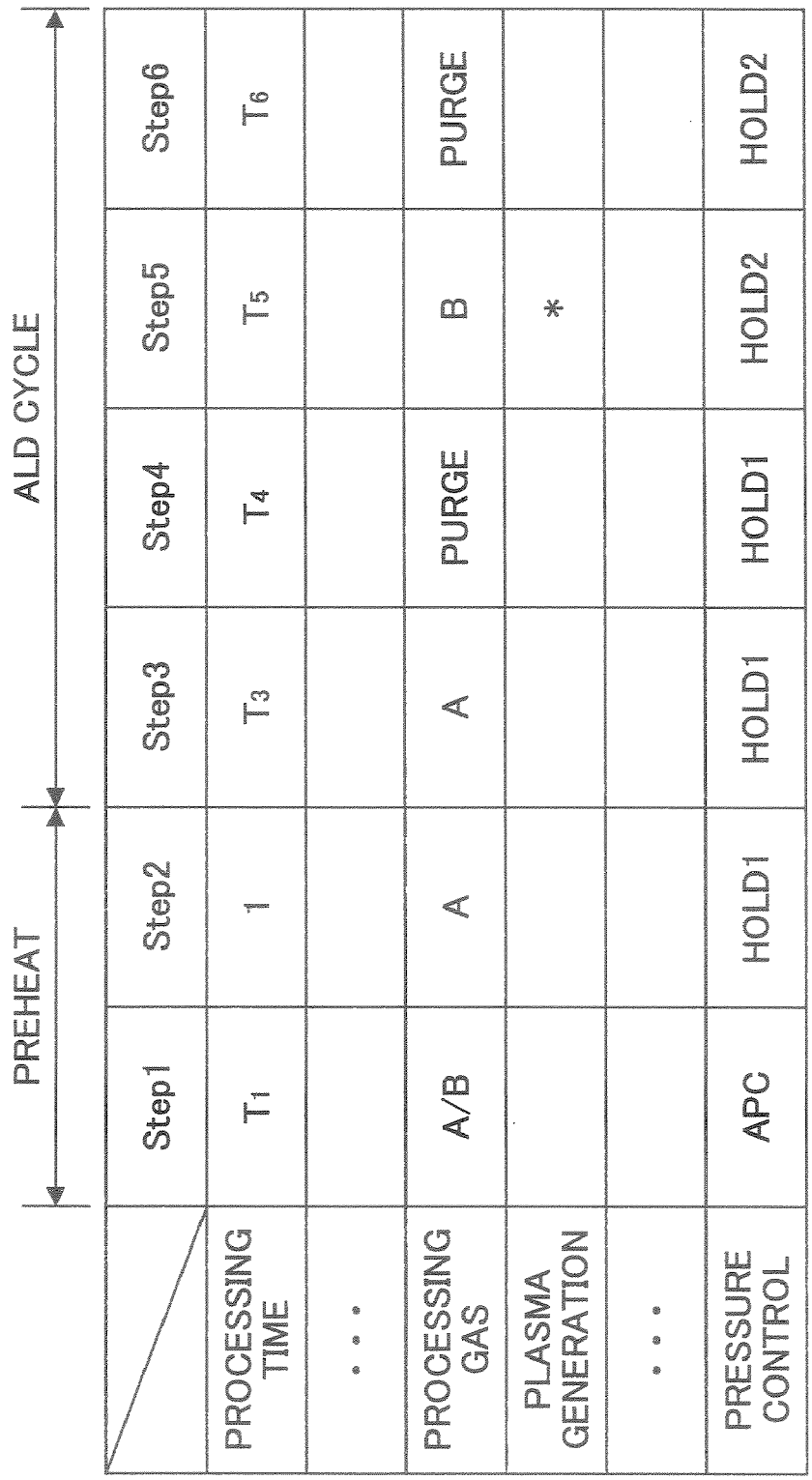
FIG. 8 is a recipe table indicating an example of a recipe according to another modification of the embodiment.
Figure 9:
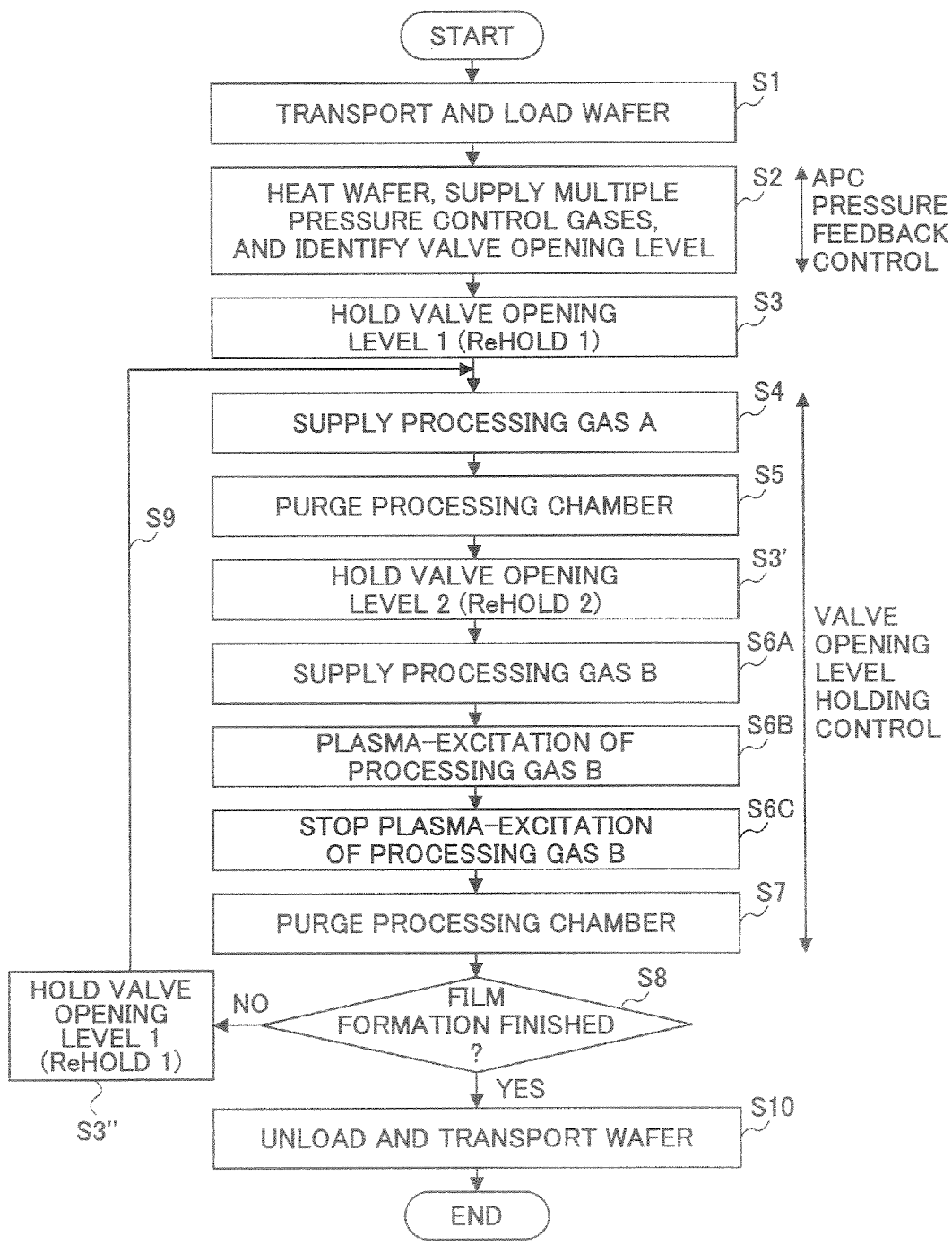
FIG. 9 is a flowchart indicating procedures of operations performed by an apparatus according to the another modification of the embodiment.

According to the present invention, as indicated in a recipe table shown in FIG. 8 and a flowchart shown in FIG. 9, during a preheating period, the processing gas A and the processing gas B are alternately supplied to the processing chamber. An APC operation is performed to identify a valve opening level of the conductance valve by applying a gas load equivalent to that of the ALD cycle, and acquire individual reference values $m_{s1}$, $m_{s2}$ for the processing gas A and the processing gas B, respectively. In the actual ALD cycle, for supplying the processing gas A into the processing chamber in step S4 (Step3), the pressure control mode is changed to HOLD valve opening level 1 in step S3, S3', to retain the valve opening level of the conductance valve at the reference value $m_{s1}$. For supplying the processing gas B in the processing chamber in step S6 (Step5), the pressure control mode is changed to HOLD valve opening level 2 in step S3', to retain the valve opening level of the conductance valve at the reference value $m_{s2}$.

Various modifications of the present invention can be made without departing from the technical scope of the present invention. For example, the present invention is particularly advantageously applied to ALD; however, the present invention is applicable to any film forming technology in which processing gas is supplied discontinuously or intermittently in a processing chamber such that pressure inside the processing chamber changes considerably within a short length of time. Accordingly, the present invention is also applicable to a method including a step other than purging inserted between the step for supplying the processing gas A and the step for supplying the processing gas B into the processing chamber, or a method without any steps inserted therebetween, such that the step for supplying the processing gas A and the step for supplying the processing gas B are continuously performed.

Furthermore, the processing object substrate according to the present invention is not limited to a semiconductor wafer;

the processing object substrate can be, for example, a glass substrate used for a flat display panel.

INDUSTRIAL APPLICABILITY

A thin film formation method and a thin film formation apparatus according to the present invention have the above described configurations and functions, and are thus capable of stably forming pressure without being affected by elements causing aging variations in the atmosphere within a processing chamber and ensuring processing reproducibility without changing the processing recipe according to Installation conditions or aging variations.

The invention claimed is:

1. A thin film formation method for forming a thin film comprising:
providing a conductance valve on an exhaust path connecting a depressurizable processing chamber and a vacuum pump,
arranging a processing object substrate inside the processing chamber,
performing once or plural times a cycle including,
supplying a first reactive gas, and
supplying a second reactive gas into the processing chamber during a film formation processing period to cause a chemical reaction between the first reactive gas and the second reactive gas;
using the chemical reaction to form the thin film on the substrate,
supplying a predetermined gas into the processing chamber by a specified flow while exhausting the inside of the processing chamber;
determining a reference value that is equal to a valve opening level of the conductance valve corresponding to a specified value of pressure inside the processing chamber by performing automatic pressure control during a preparation period before the film formation processing period starts;
stopping the automatic pressure control and maintaining the valve opening level of the conductance valve at the reference value during the film formation processing period;
variably controlling the valve opening level of the conductance valve by a pressure feedback method such that a detected value of the pressure inside the processing chamber matches the specified value;
measuring the valve opening level of the conductance valve; and
acquiring instantaneous values of the valve opening level of the conductance valve at fixed time intervals as sample values, and obtaining an average of n (n being a whole number) of the sample values.

2. The thin film formation method according to claim 1, further comprising
depositing a layer of one atom or one molecule on the substrate due to the chemical reaction between the first reactive gas and the second reactive gas in one cycle, wherein
the thin film formed on the substrate has a thickness corresponding to a number of times the cycle is performed.

3. The thin film formation method according to claim 1, wherein the preparation period is within a time period in which the substrate is not present inside the processing chamber.

4. The thin film formation method according to claim 1, wherein the preparation period is within a time period after the substrate has been arranged inside the processing chamber.

5. The thin film formation method according to claim 4, wherein the substrate is heated to a specified temperature within the preparation period, and the specified temperature of the substrate is maintained throughout the film formation processing period.

6. The thin film formation method according to claim 1, wherein during the preparation period, at least one of the first reactive gas and the second reactive gas is supplied into the processing chamber as pressure controlling gas by a gas flow equivalent to a gas flow in the film formation processing period.

7. The thin film formation method according to claim 6, wherein the first reactive gas is a source gas including as a chemical compound crude material of the thin film, and
the second reactive gas is a reducing gas that reduces the chemical compound.

8. The thin film formation method according to claim 7, wherein the second reactive gas is plasma-excited in the processing chamber to generate a radical and/or an ion.

9. The thin film formation method according to claim 1, wherein the cycle further comprises:
discharging from the processing chamber the first reactive gas that is excessive, immediately after said supplying a first reactive gas.

10. The thin film formation method according to claim 9, wherein a purge gas including an inert gas is supplied into the processing chamber.

11. The thin film formation method according to claim 9, wherein the valve opening level of the conductance valve is maintained at the reference value.

12. The thin film formation method according to claim 9, wherein the valve opening level of the conductance valve is changed to a value near a maximum value.

13. The thin film formation method according to claim 1, wherein the cycle further comprises:
discharging from the processing chamber the second reactive gas that is excessive, immediately after said supplying a second reactive gas.

14. The thin film formation method according to claim 13, wherein a purge gas including inert gas is supplied into the processing chamber.

15. The thin film formation method according to claim 13, wherein the valve opening level of the conductance valve is maintained at the reference value.

16. The thin film formation method according to claim 13, wherein the valve opening level of the conductance valve is changed to a value near a maximum value.

17. The thin film formation method according to claim 1, further comprising:
measuring the valve opening immediately before the preparation period ends.

18. The thin film formation method according to claim 1, further comprising:
adding, at the fixed time intervals, a new sample value to the n (n being a whole number) sample values consecutively acquired and simultaneously excluding an oldest sample value among the n+1 sample values, and
obtaining an arithmetic average of the n consecutive sample values acquired after replacing the oldest sample value with the new sample value.

19. The thin film formation method according to claim 1, further comprising:

detecting a value of the valve opening level of the conductance valve, obtaining a comparative error by comparing the detected value of the valve opening level and the reference value, and variably controlling the valve opening level of the conductance valve according to the comparative error.

20. The thin film formation method according to claim 1, further comprising:

supplying a first pressure controlling gas including at least the first reactive gas into the processing chamber, and determining a first reference value that is equal to the valve opening level of the conductance valve causing the pressure inside the processing chamber to substantially match a first specified value, and supplying a second pressure controlling gas including at least the second reactive gas into the processing chamber, and determining a second reference value that is equal to the valve opening level of the conductance valve causing the pressure inside the processing chamber to substantially match a second specified value, maintaining the valve opening level of the conductance valve at the first reference value during the supplying a first reactive gas, and maintaining the valve opening level of the conductance valve at the second reference value during the supplying a second reactive gas.

* * * * *